US012658373B2

(12) United States Patent
Soulier et al.

(10) Patent No.: US 12,658,373 B2
(45) Date of Patent: Jun. 16, 2026

(54) METHOD FOR MANUFACTURING AN ELECTRICAL DEVICE WITH AN ANODIC POROUS OXIDE REGION DELIMITED BY PLANARIZING A STACK OF MATERIALS

(71) Applicant: Murata Manufacturing Co., Ltd., Nagaokakyo (JP)

(72) Inventors: Brigitte Soulier, Grenoble (FR); Frédéric Voiron, Barraux (FR); Julien El Sabahy, Grenoble (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 592 days.

(21) Appl. No.: 18/065,188

(22) Filed: Dec. 13, 2022

(65) Prior Publication Data

US 2023/0187143 A1 Jun. 15, 2023
US 2023/0386751 A2 Nov. 30, 2023

(30) Foreign Application Priority Data

Dec. 13, 2021 (EP) ..................................... 21306755

(51) Int. Cl.
*H01G 4/33* (2006.01)
*C25D 11/02* (2006.01)
(Continued)

(52) U.S. Cl.
CPC ............. H01G 4/33 (2013.01); C25D 11/022 (2013.01); C25D 11/18 (2013.01); H01G 4/012 (2013.01); H10D 1/711 (2025.01)

(58) Field of Classification Search
None
See application file for complete search history.

(56) References Cited

U.S. PATENT DOCUMENTS 10,497,582 B2 12/2019 Voiron et al.
2015/0284868 A1* 10/2015 Silverman .............. C25D 3/665
428/654
(Continued)

FOREIGN PATENT DOCUMENTS

EP 3556910 A1 10/2019
EP 3567645 A1 11/2019
(Continued)

OTHER PUBLICATIONS

Banerjee, P. et al.; "Nanotubular metal-insulator-metal capacitor arrays for energy storage"; Nature Nanotechnology, vol. 4, May 2009, pp. 292-296.

*Primary Examiner* — Xiaobei Wang
(74) *Attorney, Agent, or Firm* — ArentFox Schiff LLP

(57) ABSTRACT

A method for manufacturing an electrical device that includes: anodizing a portion of an anodizable metal layer so as to obtain an anodic porous oxide region and an anodizable metal region adjoining the anodic porous oxide region, the anodic porous oxide region being thicker than the anodizable metal region; depositing a layer of liner material on the anodic porous oxide region and on the anodizable metal region; depositing a layer of filler material on the layer of liner material to obtain a stacked structure having a top surface; planarizing the stacked structure from a top surface thereof until reaching the layer of the liner material, so as to expose a portion of liner material located above at least a portion of the anodic porous oxide region; and removing the exposed portion of liner material.

12 Claims, 4 Drawing Sheets

(51) Int. Cl.
     *C25D 11/18*       (2006.01)
     *H01G 4/012*       (2006.01)
     *H10D 1/68*        (2025.01)

(56)            References Cited

U.S. PATENT DOCUMENTS

2016/0268144  A1      9/2016  Voiron et al.
2023/0071739  A1*     3/2023  Muratori ................. C23C 28/32

FOREIGN PATENT DOCUMENTS

WO          2015063420  A1      5/2015
WO      WO-2015098843  A1 *    7/2015    ........... C25D 11/022
WO          2020162459  A1      8/2020

* cited by examiner 106
105
104
100
103
101
SUB 107
106
105
100
101
SUB

METHOD FOR MANUFACTURING AN ELECTRICAL DEVICE WITH AN ANODIC POROUS OXIDE REGION DELIMITED BY PLANARIZING A STACK OF MATERIALS

CROSS REFERENCE TO RELATED APPLICATIONS

The present application claims priority to European Patent Application No. 21306755.6, filed Dec. 13, 2021, the entire contents of which are incorporated herein by reference.

FIELD OF THE INVENTION

The present invention relates to the field of integration and, more particularly, to electrical devices, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (PM) for example. The successive layers of metal, insulator, and then metal follow the contours of the porous material resulting in the MIM structure being embedded inside the pores of the porous material. Banerjee's PM embedded structure however suffers from high Equivalent Series Resistance (ESR) and limited capacitance density due to the PM thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, PAA embedded structures as described above result from embedding a structure (e.g., a MIM capacitive stack) inside a porous region above a substrate, such as a silicon wafer. Typically, the porous region results from anodizing a thin layer of metal, such as aluminum, deposited above the substrate. The anodizing converts the aluminum layer into porous anodic alumina. Typically, the porous region is formed with any shape (as viewed from the top) and extends across the alumina layer in a direction perpendicular to the wafer surface.

Delimiting the shape of the PAA can be performed by forming a hard mask having an opening onto the region which is to be anodized.

FIG. 1 is a SEM (Scanning Electron Microscope) image of a cross-section which illustrates the hard mask interface region of an exemplary porous region PR formed using a silicon dioxide hard mask HM over an aluminum layer AL. The porous region has a volume which is about 20% more than its initial pre-anodizing volume. Consequently, and because it can only grow upwards, the porous region PR is thicker than the aluminum layer AL, and there is a height difference h between the top surfaces of the two layers of about 2 to 3 micrometers.

As it is difficult to distinguish on the image, the interface between the aluminum layer AL and the hard mask HM is indicated by reference INF.

The hard mask HM is usually not ductile enough (in the illustrated example, it is a silicon dioxide hard mask) to remain perfectly conformal during the anodizing process. In fact, it has been observed that cracks can appear such as crack CR visible on FIG. 1. The cracks result from the top surface of the porous region extending upwards during the anodizing process, which deforms the hard mask as the non-anodized aluminum region remains of constant height.

Cracks can have an impact on the functionality of a subsequently deposited MIM structures (they can cause short circuits or open circuits, for example).

The height difference h is also problematic, as subsequent steps will be affected by this topology. Forming a capacitor in a porous region is generally followed by forming interconnections above the capacitor (a portion often referred to as the back-end). These interconnections comprise electrical connections and insulator regions deposited subsequently. A non-planar topology beneath the interconnections can affect their functioning and how they are deposited.

FIG. 2 is another SEM image of a cross-section which illustrates the hard mask interface region of an exemplary porous region PR formed using a silicon dioxide hard mask HM over an aluminum layer AL. In this example, not only is a crack CR formed, but there is also a penetration of electrolyte in the crack region that produces an unwanted anodizing APR.

Document EP 3556910 teaches using a metal hard mask to delimit the portion to be anodized. Using a metal hard mask, i.e. a more ductile had mask, prevents cracks from appearing. However, this solution has no effect on the height difference between the porous oxide region and the metal region.

Document EP 3567645 discloses the use of a second hard mask to form a seal above the cracked region to prevent any electrical malfunction, and to precisely delimit the pores that will contribute to the capacitance of a subsequently formed capacitor. This also limits the defects associated with cracks but also fails to overcome the issues associated with the height difference.

The present invention has been made in the light of the above problems.

SUMMARY OF THE INVENTION

The present invention provides a method for manufacturing an electrical device comprising: providing an anodizable metal layer above a substrate; anodizing a portion of the anodizable metal layer so as to obtain an anodic porous oxide region having a top surface and an anodizable metal region adjoining the anodic porous oxide region and also having a top surface, the anodic porous oxide region being thicker than the anodizable metal region so that the top surface of the anodic porous oxide region is higher than the top surface of the anodizable metal region; depositing a layer of liner material on the top surface of the anodic porous oxide region and on the top surface of the anodizable metal region; depositing a layer of filler material on the layer of liner material having a thickness that is greater than the height difference between the top surface of the anodic porous oxide region and the top surface of the anodizable metal region, the filler material being different from the liner material, to obtain a stacked structure having a top surface; planarizing the stacked structure from its top surface until reaching the layer of liner material, so as to expose a portion of liner material located above at least a portion of the anodic porous oxide region; and removing the exposed portion of liner material.

Thus, the present invention proposes to improve a structure on which an anodizing has been performed, for example by using a hard mask to delimit the portion to be anodized which has been subsequently removed. In fact, the absence of a hard mask in the obtained device implies that no cracks remain at the level of the interface between the anodized metal and the non-anodized metal.

For example, the anodizable metal region is on a side of the anodic porous oxide region.

Also, for example, the planarizing process is selective with respect to the liner material (i.e. it does not remove this material, or it removes it at a low speed).

The use of two different materials (the liner material and the filler material) allows both compensating the height difference and controlling the process that removes material and exposes a portion of the anodic porous oxide region.

The layer of filler material can be preferably thicker than the layer of liner material.

Here, the planarizing process will remove material from the stacked structure and stop when reaching the liner: this should occur above the anodic porous oxide as its top surface is higher than the top surface of the anodizable metal layer. Also, the final removing step can be performed without impacting the layer of filler material which participates to compensating the height difference, as it is thicker than the height difference.

Consequently, the obtained device will be substantially planar and the filler material is flush with the apex of the anodic porous oxide (where the liner stops the planarizing). No height difference can then be observed and any subsequent deposition step will not be affected by a topology difference.

The person skilled in the art will be able to select an anodizable metal suitable to implement the above method. Also, the liner material and the filler material can be chosen so that: the liner can be deposited on the anodizable metal, the filler can be deposited on the liner, the liner allows stopping a planarizing process, the liner can be removed where it is exposed.

According to a particular embodiment, the method comprises, prior to anodizing the portion of the anodizable metal layer, a preliminary step of forming a hard mask on the top surface of the anodizable metal layer having an opening onto a portion of the of anodizable metal layer to be anodized, wherein the method further includes a step of removing the hard mask after anodizing the portion of the anodizable metal layer.

This hard mask is the one which will delimit the area to be anodized.

Removing the hard mask can be performed through a selective etching (i.e. an etching of the hard mask material but not of the anodic porous oxide or of the anodizable metal).

According to a particular embodiment, the liner material has a thickness which is greater than two times the average pore width of the pores of the anodic porous oxide.

It has been observed that this minimal thickness will facilitate sealing the pores, which prevents any contamination inside the pores.

Also, the thickness of the liner should preferably be maintained a thin as possible (but preferably above two times the average width of the pores), so that after it is removed, the planarized surface remains substantially planar. In other words, the topology of the structure is not substantially impacted by the removal of the exposed portion of the layer of liner material.

A thin layer of liner material is also advantageous if a chemical etching of the liner material may also remove anodic porous oxide (i.e. if the selectivity between liner and anodic porous oxide is low).

According to a particular embodiment, removing the portion of liner material comprises a selective etching having a high selectivity between the liner material to be etched and the anodic porous oxide (which should preferably not be etched).

By way of example, this high selectivity can correspond to an etching speed of the liner material which is at least twice the etching speed of the anodic porous oxide.

This allows removing the exposed portion of liner material without significantly impacting the anodic porous oxide region. Preferably, removal of anodic porous oxide should be maintained under 100 nanometers of etched material.

This selectivity is particularly suitable for situations where the etching rate varies between, for example, the center and the edged of the surface to be etched, and where the anodic porous oxide can be exposed in some areas and not in others.

This embodiment facilitates having a thin layer of liner material.

According to a particular embodiment, planarizing the stacked structure comprises a using a chemical mechanical polishing configured to stop the planarizing when reaching the layer of liner material.

By way of example, the chemical mechanical polishing can use a chemical which only etches the filler material but not the liner material (i.e. a chemical with a high selectivity).

According to a particular embodiment, the method further comprises depositing by spin-coating a layer of resist material having a thickness that is greater than the height difference between the top surface of the anodic porous oxide region and the top surface of the anodizable metal region. Wherein planarizing the stacked structure comprises a nonselective etching between the resist material and the filler material.

The person skilled in the art may refer to the above step as a resist etchback step. The low selectivity between the resist material and the filler material can correspond to an etching speed of the resist material and of the filler material which is substantially the same.

Because the layer of resist material has a thickness that is greater than the height difference between the top surface of the anodic porous oxide region and the top surface of the anodizable metal region, and because spin-coating is used, a layer of resist material having a flat top surface is obtained. This allows performing a uniform and planar etching during the planarizing.

Here, planarizing will also be performed until the resist is fully etched away.

According to a particular embodiment, the anodizable metal layer comprises aluminum.

According to a particular embodiment, the anodic porous oxide region comprises substantially straight pores extending from the top surface of the anodic porous oxide region and wherein after removing the exposed portion of liner material, the pores are open onto the top surface of the portion of the anodic porous oxide region.

These substantially straight pores can be formed in various metals during the anodizing, and more precisely they can be formed in aluminum.

This particular embodiment ensures that the pores are not clogged by, for example, liner material, so that they can be used subsequently.

According to a particular embodiment, the method further comprises a layered structure deposited inside the pores of the portion of the anodic porous oxide region.

For example, the layered structure can be deposited conformally inside the pores.

According to a particular embodiment, comprises a metal-insulator-metal stack so as to form a capacitor having electrodes extending inside the pores of the portion of the anodic porous oxide region.

The metal-insulator-metal structure can be called a MIM structure, and the metal can be, for example, doped poly-silicon.

The invention also provides an electrical device comprising a substrate and, above the substrate: a layer comprising an anodizable metal region having a top surface adjoining an anodic porous oxide region also having a top surface, the anodic porous oxide region being thicker than the anodizable metal region so that the top surface of the anodic porous oxide region is higher than the top surface of the anodizable metal region; a stacked structure including a layer of liner material on the top surface of the anodizable metal region and partially above and on the top surface of the anodic portion oxide region so as to delimit an exposed portion of the anodic porous oxide region, and a layer of filler material above and on the layer of liner material having a thickness that is substantially equal to the height difference between the top surface of the anodic porous oxide region and the top surface of the anodizable metal region, wherein the stacked structure includes an opening onto the exposed portion of the anodic porous oxide region, and the stacked structure is planarized around the opening.

This device can be adapted to be obtained from any embodiment of the above defined method.

In this structure, substantially equal can mean equal, or within a range which can be plus or minus the thickness of the liner material (preferably thinner than the layer of filler material).

According to a particular embodiment, the exposed portion of the anodic porous oxide region is surrounded by a peripheral portion of the anodic porous oxide region comprising pores that are sealed by the layer of liner material.

This allows preventing lateral/peripheral pores from participating to a subsequently formed device (for example a capacitor), as it can be difficult to precisely quantify their contribution to this device.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

We will now describe a method for manufacturing a device including an anodic porous oxide region which does not include cracks and which presents a planar profile.

Figure 1:
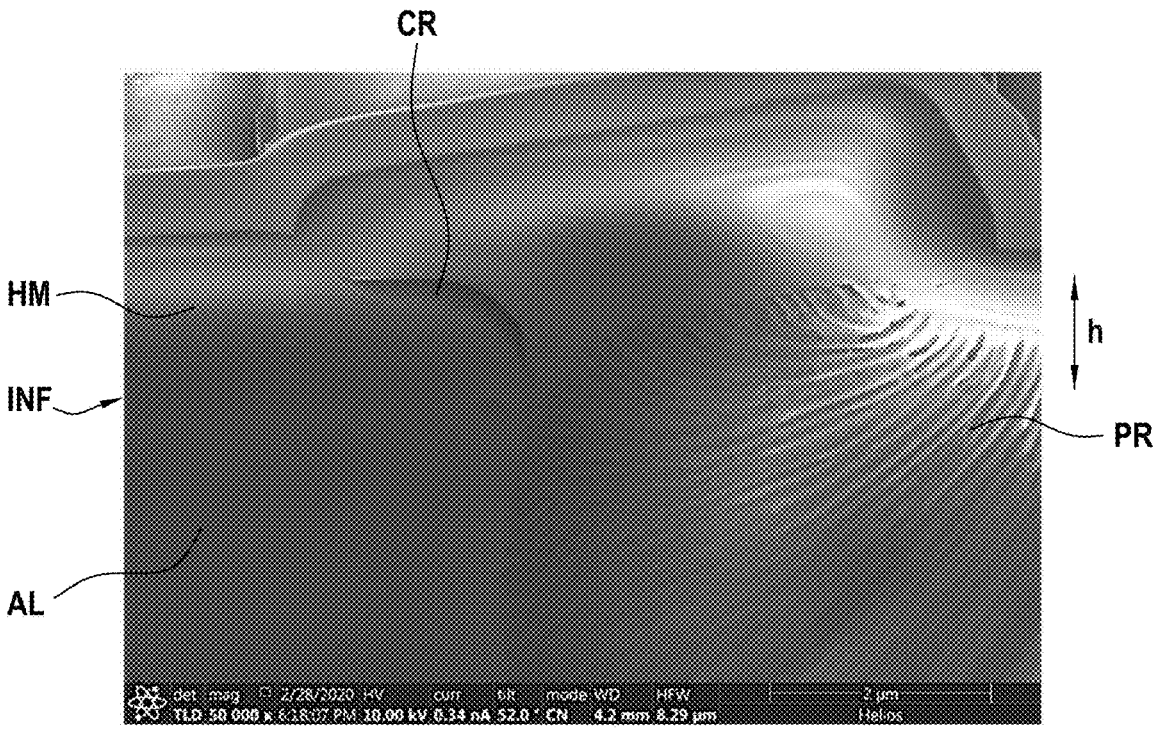
FIGS. 1 and 2, already described, are SEM images of an anodic porous oxide region.
Figure 2:
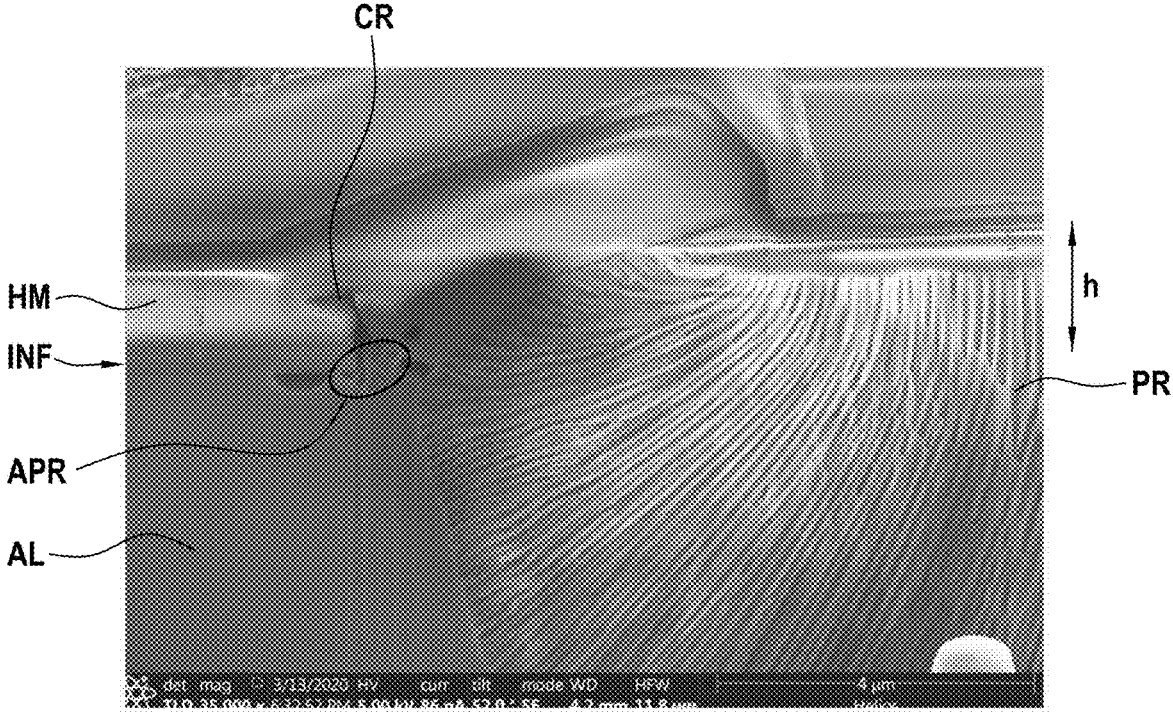
Figure 3:
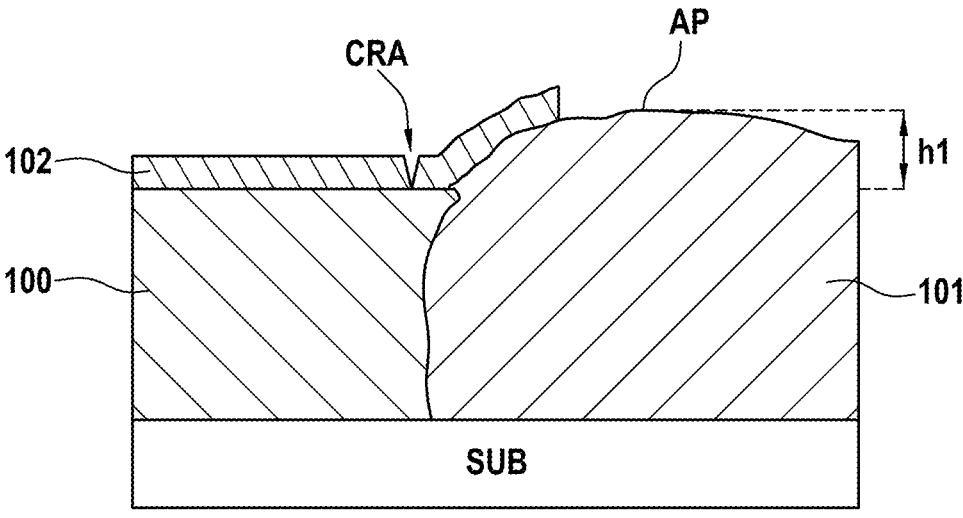
FIG. 3 is a schematic representation of a device after an anodizing.

FIG. 3 shows a device formed above a substrate SUB (for example a silicon wafer or a wafer of another material). The substrate SUB may also include a barrier layer which stops the anodizing process.

On this substrate SUB, an initial layer of anodizable metal has been formed. For example, the metal is aluminum, deposited over a thickness of a few micrometers, for example 7 micrometers. On the figure, this layer is represented after an anodizing of a portion of this layer has been performed, so as to obtain an anodizable metal region 100 and an anodic porous oxide region 101 adjoining the anodizable metal region.

As the anodizable metal is aluminum, the anodic porous oxide region comprises substantially straight pores extending from the top surface of the anodic porous oxide region to the substrate SUB. The invention is not limited to the use of aluminum and also applies for example, to other metals that can be anodized to form substantially straight pores extending from the top surface (the surface exposed during the anodizing).

The selective anodizing is obtained by means of a hard mask 102, for example a hard mask comprising silicon dioxide, and having a thickness of about 1 micrometer.

As the volume of the anodic porous oxide region 102 is greater than the corresponding initial volume of anodizable metal (by about 20%), the apex AP of the anodic porous oxide region (the top surface of the anodic porous oxide region) is higher than the top surface of the anodizable metal region 100 by a distance h1 of about 2 to 3 micrometers.

During the anodizing, the hard mask 102 has cracked, and a crack CRA is visible on the figure.

The present method aims at removing this crack while compensating the height difference h1.

Figure 4:
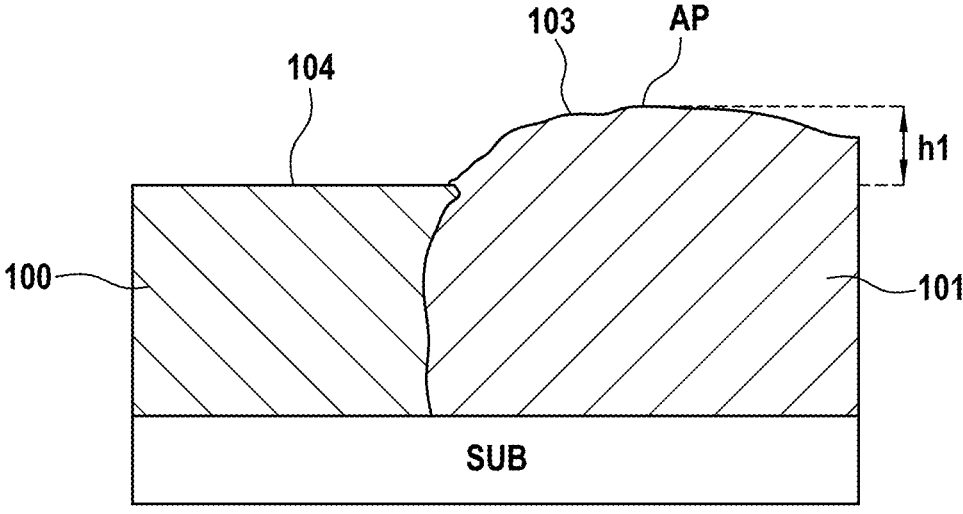
FIG. 4 shows the device of FIG. 3 after the hard mask has been removed.

As shown on FIG. 4, the hard mask 102 can be removed by a selective etch (for example using a fluorinated dry etch). This step removes the crack at the interface between the anodizable metal region 100 and the anodic porous oxide region 101.

At this stage, the top surface 104 of the anodizable metal region 100 and the top surface 103 (which includes the apex AP) of the anodic porous oxide region 101 are both exposed.

Figure 5:
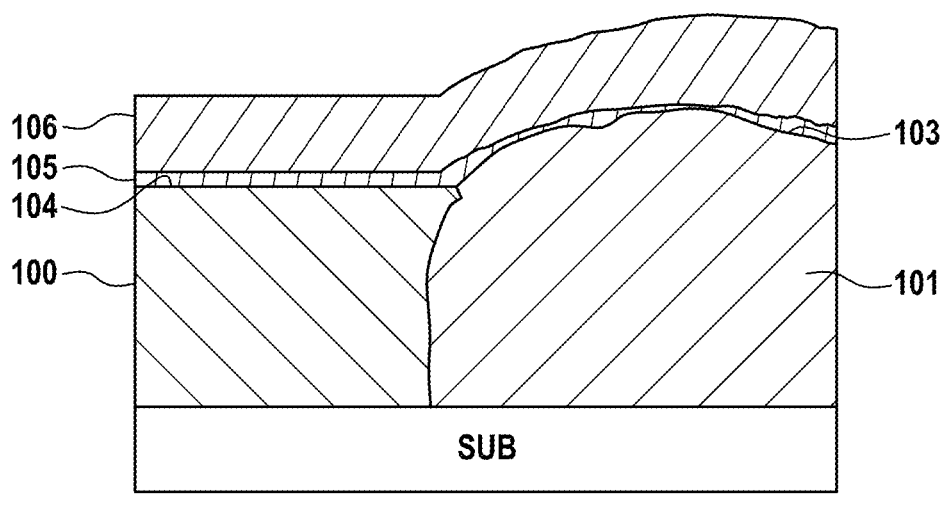
FIG. 5 shows the device of FIG. 4 after layers of liner and filler material have been deposited.

Subsequently and as shown on FIG. 5, a layer of liner material 105 is deposited on the top surface 103 of the anodic porous oxide region and on the top surface of the anodizable metal region 100.

Preferably, depositing the liner material should be performed using a process which prevents any liner material from being deposited inside a pore of the anodic porous oxide region. This prevents any contamination that could affect a subsequent deposition inside the pores and seals the pores. This can be obtained by using a thickness for the layer of liner material which is twice the average pore width.

By way of example, the layer of liner material 105 can be deposited using Plasma-Enhanced Chemical Vapor Deposition (PECVD) of silicon nitride, or Physical Vapor Deposition (PVD) of titanium nitride, with a thickness of about 300 nm, for example. In fact, in order to form a continuous layer sealing the pores of the anodic porous oxide region 101, the thickness of the layer of liner material should be greater than the pore diameter (typically 80 nm). The liner should also preferably remain thin so that it can be etched away later quickly without too much porous oxide region being etched. For example, thicknesses comprised between 200 nm and 400 nm can be used.

After depositing the layer of liner material 105, a layer of filler material 106 is deposited on the layer of liner material. The filler material differs from the liner material. It should also be deposited with a thickness greater than the height difference h1, so as to compensate this difference.

By way of example, the layer of filler material 106 can include aluminum deposited using PVD, or even silicon dioxide deposited using PECVD.

Figure 6:
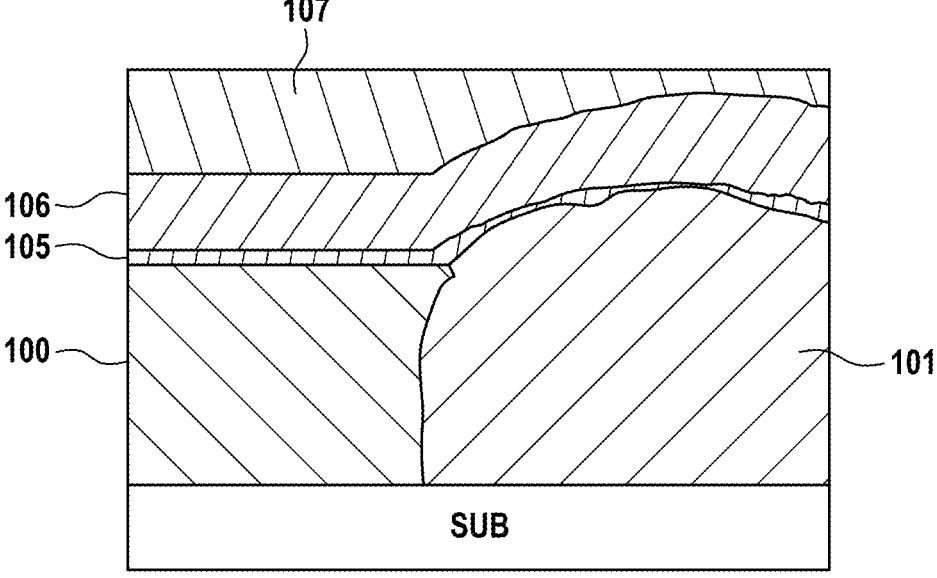
FIG. 6 shows the device of FIG. 5 after a resist has been deposited.

FIG. 6 shows a step in which a layer of resist material has been deposited, also with a thickness greater than the height difference h1. Typically, a thickness of about 3 micrometers can be deposited. The resist can be spun on to obtain a planar surface.

Figure 7:
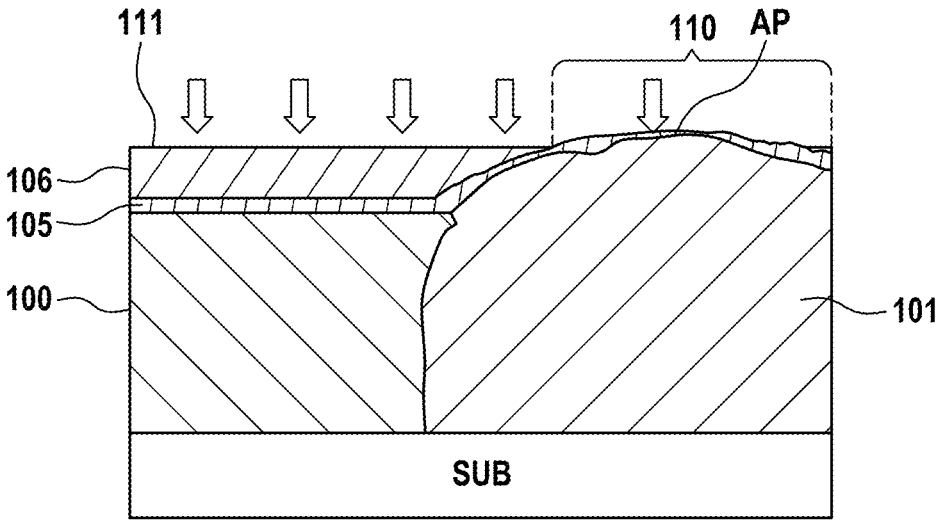
FIG. 7 shows the device of FIG. 6 after a planarizing step has been performed.

The resist material can be selected to have an etching speed which is equal to the etching speed of the filler material, with respect to a same etchant. Consequently, and as shown on FIG. 7, an etching step with this etchant can be performed (and preferably, the etchant is selective or highly selective between the resist material and the filler material to be etched on one hand, and the liner material on the other hand).

This process can be called a resist etchback by the person skilled in the art and corresponds to a planarizing step.

The planarizing/etching step is configured to be performed until reaching the layer of liner material (its top surface). This occurs above the apex AP of the anodic porous oxide region as it is also the highest portion of liner material.

At this stage, a portion 110 of liner material is exposed: it is no longer covered by filler material or by resist material. Also, the portion 110 and the new top surface 111 of the filler material form a substantially planar surface.

It should be noted that the invention is not limited to a resist etchback process and can also be implemented using a chemical mechanical polishing configured to stop the planarizing when reaching the layer of liner material.

Figure 8:
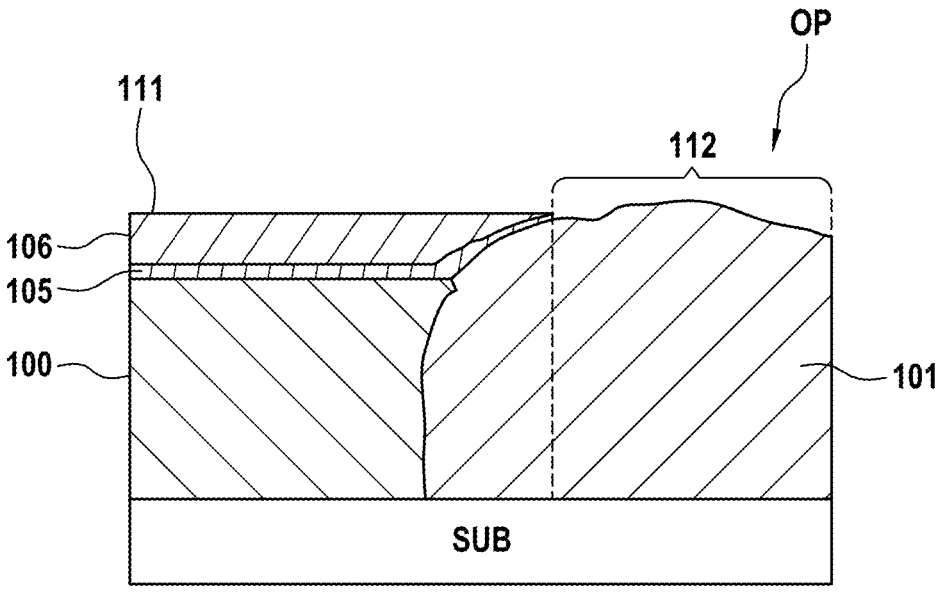
FIG. 8 shows the device of FIG. 7 after an exposed portion of liner material has been removed.

Then, and as shown on FIG. 8, the exposed portion 110 of the liner layer is removed, for example but not necessarily by using a selective etching having a high selectivity between the liner material to be etched on one hand, and the anodic porous oxide on the other hand. Also, a mask can be used to delimit the portion of liner material to be removed.

This allows obtaining a portion of anodic porous oxide region which is substantially flush with the new top surface of the layer of filler material 111.

By way of example, the difference between the two can be of less than 100 nanometers, which corresponds to the roughness of the top surface of the anodic porous oxide region.

An electrical device is obtained comprising, above the substrate SUB: a layer comprising an anodizable metal region 100 having a top surface adjoining an anodic porous oxide region 101 also having a top surface, the anodic porous oxide region being thicker than the anodizable metal region so that the top surface of the anodic porous oxide region is higher than the top surface of the anodizable metal region; a stacked structure including a layer of liner material 105 on the top surface of the anodizable metal region and partially above and on the top surface of the anodic portion oxide region so as to delimit an exposed portion 112 of the anodic porous oxide region, and a layer of filler material above and on the layer of liner material, wherein the stacked structure includes an opening OP onto the exposed portion of the anodic porous oxide region, and the stacked structure is planarized around the opening (it is substantially planar, with a roughness corresponding to the roughness of the top surface of the anodic porous oxide region).

The electrical device is free of cracks at the level of the interface between the anodizable metal region and the anodic porous oxide region.

Also, the device has a substantially planar top surface, which improves the reliability of subsequent deposition steps (typically for forming interconnections above the device).

In the portion 112 of the anodic porous oxide region, it is possible to deposit a MIM structure inside the pores, so as to form a 3D capacitor with an increased capacitance.

The portion 112 of the anodic porous oxide region is also surrounded by a peripheral portion of the anodic porous oxide region comprising pores that are sealed by the liner, this portion extending between the portion 112 and the anodizable metal region.

Document EP 3 567 645 explains how pores arranged at the periphery of an anodic porous oxide region can be problematic. These lateral pores arranged in the peripheral region have a contribution to subsequently formed electrical devices which is difficult to quantify precisely.

Here, the peripheral portion of the anodic porous oxide region is sealed, which prevents the lateral pores from participating to a subsequently formed electrical device. For example, if a capacitor is formed, these lateral pores will not participate to the capacitance of the capacitor.

The invention claimed is:

1. A method for manufacturing an electrical device, the method comprising:

providing an anodizable metal layer above a substrate;

anodizing a portion of the anodizable metal layer so as to obtain an anodic porous oxide region and an anodizable metal region adjoining the anodic porous oxide region, the anodizable metal region having a top surface and the anodic porous oxide region also having a top surface, the anodic porous oxide region being thicker than the anodizable metal region so that the top surface of the anodic porous oxide region is higher than the top surface of the anodizable metal region;

depositing a layer of liner material on the top surface of the anodic porous oxide region and on the top surface of the anodizable metal region;

depositing a layer of filler material on the layer of liner material, the layer of filler material having a thickness, above the anodizable metal region, that is greater than the height difference between the top surface of the anodic porous oxide region and the top surface of the anodizable metal region, the filler material being different from the liner material, to obtain a stacked structure having a top surface;

planarizing the stacked structure from a top surface thereof until reaching the layer of liner material, so as to expose a portion of the liner material located above at least a portion of the anodic porous oxide region, and so that the layer of filler material has a thickness, above the anodizable metal region, that is substantially equal to a height difference between the top surface of the anodic porous oxide region and a top surface of the liner material overlaying the anodizable metal region; and removing the exposed portion of the liner material.

2. The method of claim 1, further comprising, prior to anodizing the portion of the anodizable metal layer, forming a hard mask on the top surface of the anodizable metal layer having an opening onto a portion of the anodizable metal layer to be anodized; and removing the hard mask after the anodizing of the portion of the anodizable metal layer.

3. The method of claim 1, wherein the liner material has a thickness which is greater than two times an average pore width of pores of the anodic porous oxide.

4. The method of claim 1, wherein the removing of the portion of the liner material comprises a selective etching having a high selectivity between the liner material to be etched and the anodic porous oxide.

5. The method of claim 1, wherein the planarizing of the stacked structure comprises a using a chemical mechanical polishing configured to stop the planarizing when reaching the layer of the liner material.

6. The method of claim 1, further comprising depositing by spin-coating a layer of resist material having a thickness that is greater than a height difference between the top surface of the anodic porous oxide region and the top surface of the anodizable metal region, and wherein the planarizing of the stacked structure comprises a non-selective etching between the resist material and the filler material.

7. The method of claim 1, wherein the anodizable metal layer comprises aluminum.

8. The method of claim 1, wherein the anodic porous oxide region comprises substantially straight pores extending from the top surface of the anodic porous oxide region and wherein after the removing of the exposed portion of liner material, the pores are open onto the top surface of the portion of the anodic porous oxide region.

9. The method of claim 8, further comprising depositing a layered structure inside the pores of the portion of the anodic porous oxide region.

10. The method of claim 9, wherein the layered structure comprises a metal-insulator-metal stack so as to form a capacitor having electrodes extending inside the pores of the portion of the anodic porous oxide region.

11. An electrical device comprising:

a substrate; and above the substrate, a layer comprising an anodizable metal region adjoining an anodic porous oxide region, the anodizable metal region having a top surface and the anodic porous oxide region also having a top surface, the anodic porous oxide region being thicker than the anodizable metal region so that the top surface of the anodic porous oxide region is higher than the top surface of the anodizable metal region;

a stacked structure including a layer of liner material on the top surface of the anodizable metal region and partially above and on the top surface of the anodic porous oxide region so as to delimit an exposed portion of the anodic porous oxide region, and a layer of filler material above and on the layer of the liner material, the layer of filler material having a thickness, above the anodizable metal region, that is substantially equal to a height difference between the top surface of the anodic porous oxide region and a top surface of the liner material overlaying the top surface of the anodizable metal region, wherein the stacked structure includes an opening onto the exposed portion of the anodic porous oxide region, and the stacked structure is planarized around the opening.

12. The electrical device of claim 11, wherein the exposed portion of the anodic porous oxide region is surrounded by a peripheral portion of the anodic porous oxide region comprising pores that are sealed by the layer of the liner material.

* * * * *